US010573585B2

United States Patent
Joshi et al.

(10) Patent No.: US 10,573,585 B2
(45) Date of Patent: Feb. 25, 2020

(54) POWER CONVERTER HAVING A CONDUCTIVE CLIP

(71) Applicant: TEXAS INSTRUMENTS INCORPORATED, Dallas, TX (US)

(72) Inventors: Rajeev Dinkar Joshi, Cupertino, CA (US); Jie Mao, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/925,191

(22) Filed: Mar. 19, 2018

(65) Prior Publication Data

US 2019/0287885 A1    Sep. 19, 2019

(51) Int. Cl.
| | |
|---|---|
| *H01L 23/495* | (2006.01) |
| *H01L 23/64* | (2006.01) |
| *H01L 23/00* | (2006.01) |
| *H01L 23/492* | (2006.01) |

(52) U.S. Cl.
CPC ...... *H01L 23/49575* (2013.01); *H01L 23/492* (2013.01); *H01L 23/49551* (2013.01); *H01L 23/49589* (2013.01); *H01L 23/642* (2013.01); *H01L 24/32* (2013.01); *H01L 24/37* (2013.01); *H01L 24/40* (2013.01); *H01L 24/41* (2013.01); *H01L 2224/37147* (2013.01); *H01L 2224/40245* (2013.01); *H01L 2224/48137* (2013.01); *H01L 2224/48247* (2013.01); *H01L 2224/49111* (2013.01); *H01L 2224/73221* (2013.01); *H01L 2224/83801* (2013.01); *H01L 2924/1033* (2013.01); *H01L 2924/13091* (2013.01); *H01L 2924/14* (2013.01); *H01L 2924/181* (2013.01); *H01L 2924/30107* (2013.01)

(58) Field of Classification Search
None
See application file for complete search history.

(56) References Cited

U.S. PATENT DOCUMENTS

| | | | |
|---|---|---|---|
| 8,062,932 B2 * | 11/2011 | Hebert | H01L 23/49524 438/121 |
| 8,431,979 B2 * | 4/2013 | Herbsommer | H02M 3/00 257/299 |
| 9,601,453 B2 * | 3/2017 | Hebert | H01L 29/781 |

* cited by examiner

*Primary Examiner* — Telly D Green
(74) *Attorney, Agent, or Firm* — Dawn Jos; Charles A. Brill; Frank D. Cimino

(57) ABSTRACT

A power supply module includes a metallic clip including a plate having an area and a first and a second ridge on opposite sides of the plate. The ridges bent in the same direction away from the plate. The first and the second ridges conductively attached to the substrate, where the substrate is of insulating material integral with metal traces, the plate roofing over the substrate between the ridges. A first MOS field-effect transistor (FET) chip and, horizontally side-by-side, a second MOSFET chip are attached and wire bonded to the substrate under the plate. The drain of the first MOSFET is connected to the input terminal of the module, the source of the first MOSFET is tied to the drain of the second MOSFET, and the source of the second MOSFET, together with the second ridge, is connected to ground. A driver and controller chip is attached to the substrate under the plate and wire bonded to the gates of the first and second MOSFET. A capacitor is attached to the substrate under the clip plate and conductively connected to the first clip ridge and to the drain of the first MOSFET.

17 Claims, 3 Drawing Sheets

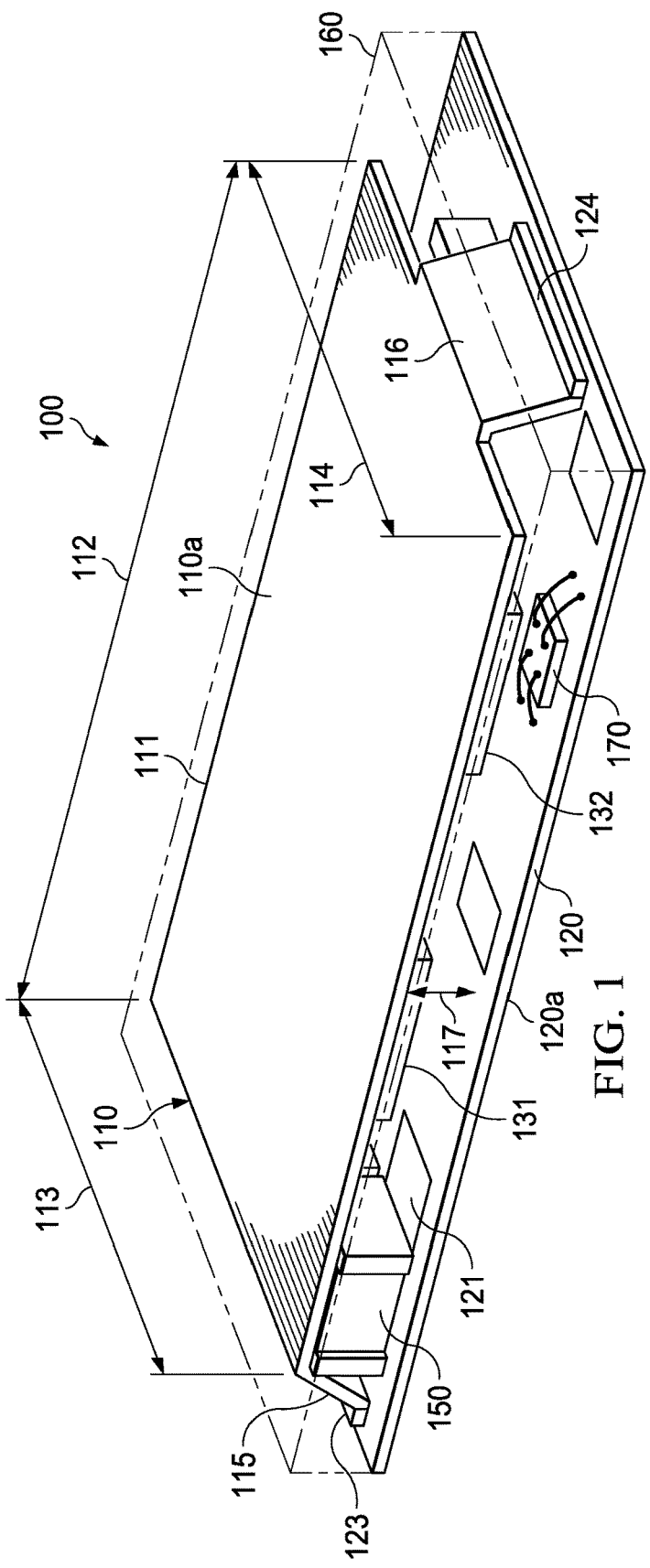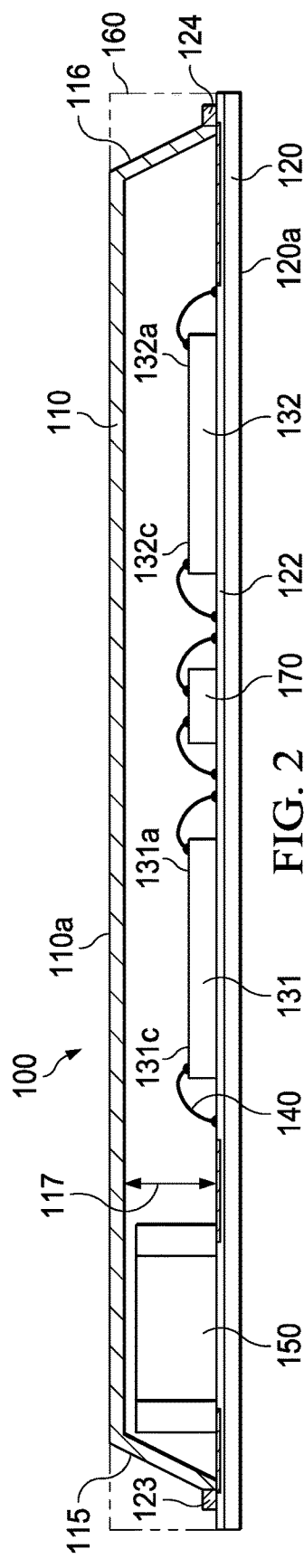

POWER CONVERTER HAVING A CONDUCTIVE CLIP

TECHNICAL FIELD

Embodiments of the invention are related in general to the field of semiconductor devices and processes, and more specifically to a system structure and fabrication method of a high voltage power supply module having a conductive clip.

DESCRIPTION OF RELATED ART

Among power switching devices are the DC-DC converters including Switched Mode Power Supply circuits. Particularly suitable for the emerging power delivery requirements are the synchronous Buck converters with two power MOS field effect transistors (FETs) connected in series and coupled together by a common switch node. In the Buck converter, a control FET chip, also called the high side switch, is connected between the supply voltage $V_{IN}$ and an LC output filter, and a synchronous (sync) FET chip, also called the low side switch, is connected between the LC output filter and ground potential.

The gates of the control FET chip and the sync FET chip are connected to a semiconductor chip including an integrated circuit (IC) acting as the driver of the converter, and the driver, in turn, is connected to a controller IC. Preferably, both ICs are integrated on a single chip.

The inductor of the output circuitry serves as the energy storage of the power supply circuit. Consequently, the inductor has to be a large enough component (typical sizes are 300 to 400 nH) to reliably function for maintaining a constant output voltage $V_{OUT}$.

For many of today's power switching devices, the chips of the power MOSFETs and the chip of the driver and controller IC are made of silicon and assembled as individual components. Each chip is typically attached to a rectangular shaped pad of a metallic leadframe; the pad is surrounded by leads as output terminals. The leads are commonly shaped without cantilever extensions, and arranged in the manner of Quad Flat No-Lead (QFN) or Small Outline No-Lead (SON) devices. The electrical connections from the chips to the leads are provided by bonding wires, which add, due to their lengths and resistances, significant parasitic inductance into the circuit. Each assembly is typically packaged in a plastic encapsulation, and the packaged components are employed as discrete building blocks for board assembly of power supply systems.

In other power switching devices, the power MOSFET chips and the driver-and-controller IC are assembled horizontally side-by-side on a leadframe pad, which in turn is surrounded on all four sides by leads serving as device terminals. The leads are shaped in QFN or SON fashion. The electrical connections between the chips and the leads may be provided by bonding wires; in some recently introduced advanced assemblies, clips made of copper substitute for many connecting wires. These clips add less parasitic inductance than do wires.

In another recently introduced scheme, the control FET chip and the sync FET chip, both made of silicon, are assembled vertically on top of each other in a stack, with the physically larger-area chip of the two attached to the leadframe pad, and with clips providing the connections to the switch node and the stack top tied to input supply $V_{IN}$. Usually, the sync FET chip is assembled onto the leadframe pad and the control FET chip is tied to the input supply $V_{IN}$.

The pad may be connected to ground potential and serves as a spreader of operationally generated heat. It has been observed, however, that during the initial on-stages the voltage at the switch node may display a ringing mode up to 25 V, which may last about 50 ns.

In order to alleviate this ringing disturbance, another recent proposal (U.S. Pat. No. 8,431,979, issued Apr. 30, 2013, "Power Converter Having Integrated Capacitor" by J. Herbsommer et al.) inserts a capacitor between the top clip tied to the input terminal and the leadframe pad tied to ground potential. Since the root cause of the ringing was found to be the exchange of energy between parasitic inductances mainly associated with the top clip at input node and the capacitance across the sync FET, the capacitor network connected between $V_{IN}$ and ground in parallel with the converter helps to channel the ringing energies from the capacitor associated with the converter's sync transistor at the output switch node through the capacitor network into the ground node.

Recently the III-V compound gallium nitride (GaN) became commercially available as a base semiconductor material. Due to the wide band gap, the compound has a special appeal for optoelectronic applications such as blue light-emitting diodes. Furthermore, transistors made of GaN can operate at high voltages and high temperature, making them attractive for power converters operating at high frequencies. The cost of GaN-based devices has come down significantly, since thin films of GaN can be deposited on zinc oxide, silicon carbide, and silicon wafers.

SUMMARY

One example provides a power supply module. The power supply module includes a metallic clip including a plate having an area and a first and a second ridge on opposite sides of the plate. The ridges bent in the same direction away from the plate. The first and the second ridges conductively attached to the substrate, where the substrate is of insulating material integral with metal traces, the plate roofing over the substrate between the ridges. A first MOS field-effect transistor (FET) chip and, horizontally side-by-side, a second MOSFET chip are attached and wire bonded to the substrate under the plate. The drain of the first MOSFET is connected to the input terminal of the module, the source of the first MOSFET is tied to the drain of the second MOSFET, and the source of the second MOSFET, together with the second ridge, is connected to ground. A driver and controller chip is attached to the substrate under the plate and wire bonded to the gates of the first and second MOSFET. A capacitor is attached to the substrate under the clip plate and conductively connected to the first clip ridge and to the drain of the first MOSFET.

Another example provides a method for fabricating a power supply module. Passive electronic components including a capacitor are assembled on a substrate of insulating material integral with metal traces. Then, a first MOS field-effect transistor (FET), a chip with a second MOSFET, and a chip with a driver and controller circuit are assembled on the substrate, horizontally and side-by-side a chip. The drain of the first MOSFET is connected, by wire bonding and traces, to the input terminal of the power supply module, the source of the first MOSFET to the drain of the second MOSFET, the source of the second MOSFET to ground, and the MOSFET gates to the driver-and-controller terminals. Then the capacitor is connected to the drain of the first MOSFET and the input terminal of the module. A metallic clip is provided including a plate having an area and a first and a second ridge on opposite sides of the plate, the ridges bent in the same direction away from the plate. Then, the ridges are conductively attached to the substrate so that the area of the plate forms a roof over the assembled chips and passive components, the first ridge is tied to the capacitor and the second ridge is tied to ground. The space between the substrate and the clip is filled with a packaging material, thereby encapsulating the assembled chips and passive components while leaving the outer surfaces of the clip and the substrate free of packaging material.

BRIEF DESCRIPTION OF THE DRAWINGS

FIG. 1 illustrates a perspective view of a packaged synchronous Buck converter with a decoupling capacitor and low-inductance clip according to the invention.

FIG. 2 shows a cross section of the synchronous Buck converter with a decoupling capacitor and low-inductance clip according of FIG. 1.

DETAILED DESCRIPTION OF THE EMBODIMENTS

Figure 3:
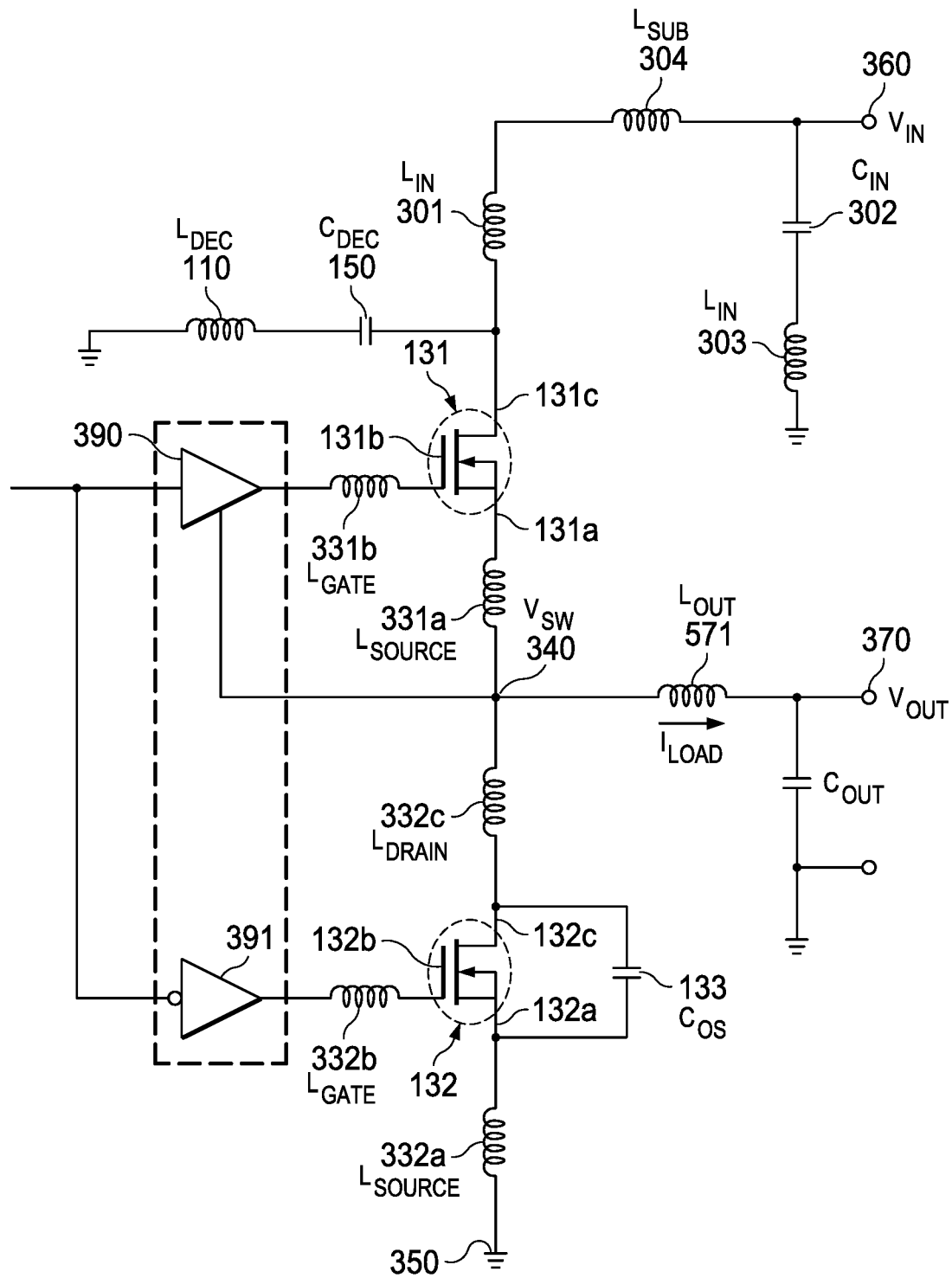
FIG. 3 is a circuit diagram of a synchronous Buck converter according to the invention.

Building on the experience with power converters using silicon chips, attempts in incorporating capacitor networks on the circuit board are ineffective in reducing the ringing when the parasitic inductance associated with the traces that connect the capacitor to the power module are too high; this is especially true when the capacitor is connected with bond wires to the transistor terminals.

Due to their lateral construction, field effect transistors made of GaN cannot be stacked or flip-chip assembled; consequently, they have to be wire bonded. In contrast, the one or more capacitors for reducing the ringing problem can utilize low-inductance traces of the board metallization.

The ringing problem is solved at the switch node of power modules using GaN chips, using a method of structuring and fabricating the power loop, the control loop, and the decoupling capacitor so that not only a low-value for the parasitic inductance of the capacitor loop is achieved, but also concurrently cross-coupling and cross-talk of the power and control loops are dissolved, and the heat dissipation for high-frequency power switching is enhanced.

One power module has a synchronous Buck converter using two GaN chips with filed effect transistors (FETs) horizontally side-by-side assembled on an insulating substrate made of ceramic with good heat dissipation and electrical insulation; metal traces are integral with the substrate. The FET terminals are wire bonded to the substrate traces. The module further includes a driver and control chip assembled on the substrate and wire bonded to the FET gates. In addition, at least one capacitor, attached to the substrate, is inserted between the input terminal and ground. The connection to ground is constructed as a metallic clip with a flat plate portion of an area flanked by two ridges bent an angle in the same direction from the plate; one ridge is tied to the capacitor, the other ridge to ground, while the flat plate spans like a roof over the assembled synchronous Buck converter, control loop and capacitor. The clip has inherently low parasitic inductance, effectively isolates cross coupling between power loop and control loop, and acts, when made of high thermal conductivity material such as copper, as an additional heat sink.

Various examples of the disclosure use MOSFETs in a source-down configuration, but the invention may be implemented in other configurations such as with the FETs in a drain-down configuration, in which the terminal polarities of the FETs are reversed. Persons skilled in the art may also substitute the MOSFETs with bipolar transistors to implement the invention without undue experiments.

FIGS. 1 and 2 illustrate an exemplary embodiment of the invention, a high frequency power supply converter generally designated 100. Assembled on an insulating substrate 120 is a plurality of active and passive electronic components including a metallic clip 110. Substrate 120 is preferably made of a ceramic material of high thermal conductivity, and clip 110 is selected from a material of high thermal conductivity including metals such as copper, copper alloy, aluminum, and silver, and graphene. The outer surface 110a of clip 110 may have a metallurgical configuration to facilitate solderability or thermal radiation. The assembly is encapsulated in a plastic package 160 preferably so that the top surface 110a of the clip and the bottom surface 120a of the substrate remain un-encapsulated and thus available to conduct thermal energy away from converter 100. For clarity purposes, the material for package 160 is shown transparent in FIGS. 1 and 2; in reality, however, package 160 is preferably made of an opaque compound such as an epoxy-based molding formulation.

Substrate 120 includes metal pads and traces preferably made from at least one metal layer patterned into traces and pads. In FIG. 1, the metal pads and traces are indicated by contact areas 121, and in FIG. 2 by portions of layer 122. For some devices, substrate 120 may also include metal barriers; FIGS. 1 and 2 display barrier 123 and barrier 124. The pads and barriers may be at electrical potentials; for instance, in the embodiment of FIGS. 1 and 2, barrier 124 may be connected to ground potential.

As FIG. 1 indicates, clip 110 includes a plate 111 with an outer surface 110a. The plate 111 has an area bordered by length 112, first side 113 and second side 114. Preferably second side 114 has the same length as first side 113. As further shown in FIGS. 1 and 2, clip 110 includes a ridge 115 (first ridge) connected to first side 113, and a ridge 116 connected to second side 114. The ridges may have the same area or different areas. Both ridge 115 and ridge 116 are bent in the same direction away from plate 111; in FIGS. 1 and 2, both ridges are bent away from plate 111 by an acute angle.

FIGS. 1 and 2 indicate that ridge 115 and ridge 116 are attached to substrate 120. To facilitate the attachment, metallic barriers 123 and 124 may have solderable surfaces so that ridge 115 can be soldered to barrier 123 and ridge 116 can be soldered to barrier 124. As mentioned, for the embodiment on FIGS. 1 and 2, barrier 124 is tied to ground. As a result of the attachment of clip 110 on substrate 120, plate 111 is roofing over the substrate area between the attached ridges. It is preferred that plate 111 is approximately parallel to substrate 120; consequently, the distance 117 between plate 111 and substrate 120 is substantially constant and provides space for assembling components on the substrate under the roof of the clip.

FIG. 2 illustrates that a plurality of components are assembled on substrate 120 and interconnected by traces 122. In the exemplary embodiment, as parts of a synchronous Buck converter, a first MOS field effect transistor (FET) chip 131 and, horizontally side-by-side, a second MOS FET chip 132 are attached and bonded by wires 140 to substrate 120 under plate 111. In the example, chips 131 and 132 are made of gallium nitride; in other embodiments, they may be made of silicon, silicon germanium, gallium arsenide or other semiconductor compounds used for semiconductor devices. Chip 131 includes the control transistor and chip 132 includes the synchronous (sync) transistor of the converter. In electrical terms, the drain 131c of first (control) FET 131 is connected to the input terminal $V_{IN}$, which may coincide with barrier 123. The source 131a of first (control) FET 131 is tied to the drain 132c of the second (sync) FET 132. The source 132a of the second FET is connected to ground, which may coincide with barrier 124.

FIGS. 1 and 2 further indicate that a first capacitor 150 is attached to substrate 120 under the plate 111 and conductively connected to the ridge 115 and to the drain 131c of first FET 131. The capacitor is integrated into the synchronous Buck converter using clip 110, which is formed to have a low inductance. Capacitor 150 is sized so that it can divert, in conjunction with the inductance of clip 110, a large portion of the energy between input inductance and output capacitor, which causes oscillations at the onset of converter operation (so called ringing) from the converter switch node to ground. As a result of this decoupling action, ringing oscillations of within the control loop of the converter are significantly reduced.

It should be pointed out that in certain embodiments a second or even more capacitors may be employed in parallel to first capacitor 150. The additional capacitors may be positioned under the roofing clip plate at various locations of the substrate area.

FIG. 1 shows that the integrated circuit chip 170 including the driver and controller functions of the converter, together with the connecting network of traces to the converter, is assembled on the substrate area under the roof of plate 111. The terminals of the chip 170 are wire bonded to the gates first FET 131 and second FET 132. Due to the arrangement of the control loop under the inductance of roofing plate 111 and thus inside of the package of the converter, the control loop of the converter is largely decoupled from the power loop. Consequently, cross talk between the control loop and power loop is largely suppressed.

As FIGS. 1 and 2 show, the distance 117 between substrate 120 and plate 110 roofing over the substrate after clip attachment is greater than the heights of the capacitor 150 and the bonding wire loops 140. In addition, since clip 110 is formed to roof over the network of the converter as well as over the network of driver and controller, power loop and control loop are largely decoupled. The converter network, the driver/controller network, and the ringing-suppressing capacitor/inductance network are summarized in the circuit diagram of FIG. 3.

In FIG. 3, electrical energy may exchange between the input inductance $L_{IN}$ (301) and the parasitic output capacitance $C_{OS}$ (133) of the sync FET (132). This is the root cause of the ringing phenomenon. By introducing decoupling capacitor $C_{DEC}$ (150), the ringing energies may be diverted through the $C_{DEC}$ (150) to ground, thus reducing the oscillations of voltage at switch node 340. Decoupling inductance $L_{DEC}$ is the parasitic inductance associated with clip 110, especially the plate 111, connected to capacitor $C_{DEC}$ (150). The converter network listed in FIG. 3 includes the sync FET (132) and the control FET (131). Further listed in FIG. 3 are the input capacitor $C_{IN}$ (302), the input inductance $L_{IN}$ (303), and the inductance $L_{SUB}$ (304) associated with the ceramic substrate 120.

As FIG. 3 shows, an input current flowing from supply $V_{IN}$ (360) to the drain 131c of control FET 131 encounters a substrate inductance $L_{SUB}$ (304) and the input inductance (wire bond inductance of drain connection) $L_{IN}$ (301). Gate 131b is connected to a respective wire bond with inductance $L_{GATE}$ 331b to driver 390. The parasitic inductance $L_{SOURCE}$ (331a) originates in conjunction with wire bonding of source 131a. FIG. 3 further lists the electrical parasitics in conjunction with the source-down connection of sync FET 132 to the substrate pad at ground potential 350. The connection of source 132a to the pad is performed by wire bonding and the parasitic inductance is $L_{SOURCE}$ (332a). The parasitic inductance of drain 132c is $L_{DRAIN}$ (332c) and determined by wire bonding. Gate 132b is connected by wire bond to driver 391 and creates inductance $L_{GATE}$ (332b). In FIG. 3, the load current $I_{LOAD}$ of the converter flows from switch node 340 through wire bond to an output inductor $L_{OUT}$ (371) and $V_{OUT}$ (370).

In the exemplary power module of FIGS. 1 and 2, several components can be designed for the control of the voltage ringing at the switch node. They include the size of the (one or more) capacitors $C_{DEC}$ (150) and the geometries of clip 110 that connects the capacitors to ground. Electrical simulations were performed on exemplary gallium nitride half bridge power modules with identical component layouts. The simulations compared a first module assembled on an aluminum-nitride substrate integral with a single-sided patterned copper metallization (100 μm layer thickness) and a copper clip (layout-sized, 250 μm thickness), to a second module assembled on an aluminum-nitride substrate integral with double-sided copper metallization (100 μm thickness) and metal-filled via holes extending through the substrate thickness and connecting the copper metallizations.

The results showed for the first module a power loop inductance of 8.5 nH and for the second module a power loop inductance of 9.1 nH. From this result it can be concluded that both module structures deliver similar inductances. Actually, a copper clip may deliver a somewhat smaller inductance and is thus a preferred configuration. In addition, a copper clip as a stand-alone piece part is a preferred solution due to its lower cost compared to a backside metal layer deposited on the ceramic substrate, coupled with the need for a plurality of metal-filled via holes through the substrate for connecting the back-sider metallization to the half bridge power module assembled on the front-side of the substrate. Further, a copper clip offers itself as an additional heat spreader for dissipating the thermal energy created by the power module operating at high frequency.

The same solution of using a metal clip and its small parasitic inductance can be scaled for other high power modules which require multi-metal layer substrates.

Another embodiment of the invention is a method for fabricating a power converter based on chips made of gallium nitride (GaN). DC-DC converters using field effect transistors made in chips of GaN, a wide band gap semiconducting III-V compound, offer operation at high voltage, high switching frequency, and high temperature. The cost of GaN-based devices has come down significantly, since thin films of GaN can be deposited on zinc oxide, silicon carbide, and silicon wafers.

Figure 4:
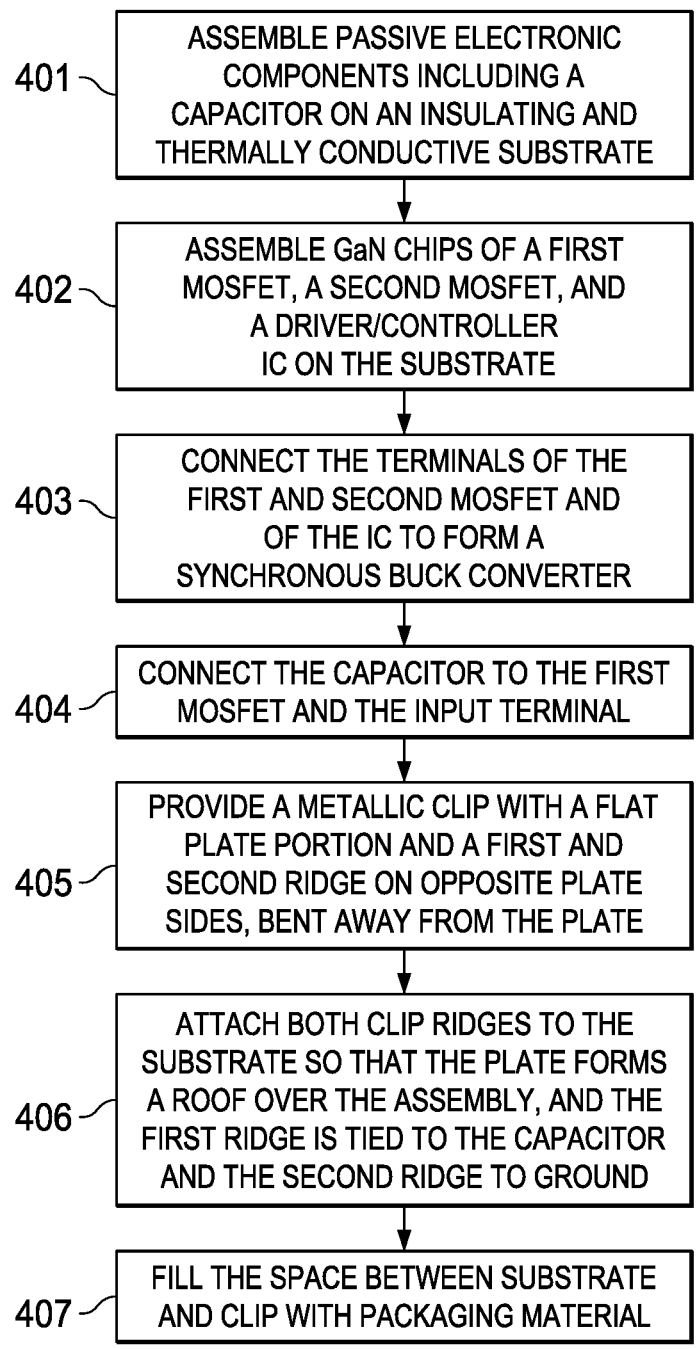
FIG. 4 is a flow diagram of a process for the fabrication of a power converter module.

The flow of certain processes of the fabrication method is summarized in FIG. 4. To insure effective heat dissipation from high output power modules, an insulating substrate of high thermal conductivity is selected for the fabrication. A preferred material is a ceramic compound of high thermal conductivity integral with at least one conductive layer, such as a metal layer which can be patterned into conductive traces.

In process 401 of FIG. 4, passive electronic components are assembled on the substrate. For reducing or suppressing any voltage ringing at switching, at least one capacitor is among the passive components. In process 402, a GaN chip with a first MOS field-effect transistor (FET), a second GaN chip with a second FET, and a chip (preferably silicon) with a driver and controller circuitry are horizontally and side-by-side assembled on the substrate and wire bonded to the substrate.

In order to create the connections for the power loop and the driver-and-controller loop of a synchronous Buck converter, the connections among the chips, summarized in process 403 of FIG. 4, are performed so that the drain of the first MOSFET is tied to the input terminal of the module, the source of the first MOSFET is tied to the drain of the second MOSFET, and the source of the second MOSFET is tied to ground. Furthermore, the gates of the FETs are tied to the driver-and-controller terminals.

In process 404 of FIG. 4, one terminal of the capacitor is connected, preferably by substrate traces, to the drain of the first MOSFET and thus also to the input terminal of the module. The other terminal of the capacitor is tied to the clip (see below).

In process 405, a conductive clip is provided which includes a flat plate portion having an area and a first and a second ridge on opposite sides of the plate. Both ridges are bent in the same direction away from the plate, preferably by an acute angle. The material of the clip is selected from a group including copper, copper alloy, aluminum, silver, graphene, and materials of high electrical and thermal conductivity.

In the next process 406, both clip ridges are attached to the substrate so that the area of the plate forms a roof over the assembled chips and passive components, the first ridge is tied to the capacitor and the second ridge is tied to ground. In the configuration after the clip attachment, the distance between the substrate and the plate roofing over the substrate is greater than the heights of the capacitor and the bonding wire loops. With this arrangement, a space is defined, which physically includes the power loop as well as the control loop, and in which the low-inductance clip can electrically act to isolate the coupling between the power loop and the control loop, effectively resolving any cross-coupling between the two loops.

In the next process 407, the space between the substrate and the clip is filled with a packaging material. A preferred method is a transfer molding process using an epoxy-based molding compound. By this filling process, the assembled chips, passive components, and wire bonds are encapsulated while the outer surfaces of the metallic clip as well as the ceramic substrate remain free of packaging material so that they can serve to enhance external heat sinking.

It is a technical advantage that compared to conventional power modules using silicon MOSFET chips and lateral or stacked chip designs, the power module of FIGS. 1, 2, and 3 based on gallium nitride MOSFET chips has smaller power loop inductance and thus offers reduced voltage ringing at power switching.

It is another technical advantage that compared to multi-layer printed circuit board structures, the use of a ceramic substrate offers significantly improved heat dissipation.

It is another advantage that compared to multilayer ceramic structures, the use of a metallic clip together with a patterned single-layer ceramic substrate is significantly less expensive.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the invention applies to power converters using MOSFET chips made of any semiconductor material, including silicon, germanium, silicon germanium, III-V compounds and II-VI compounds used in semiconductor manufacturing.

As yet another example, two or more capacitors $C_{DEC}$ may be integrated into the power supply module, together with respective parasitic inductances $L_{DEC}$.

As yet another example, the conductive clips may have a variety of geometrical configurations, including a variety of configurations for the ridges.

It is therefore intended that the appended claims encompass any such modifications or embodiments.

We claim:

1. A semiconductor package comprising:
  a plate including an area;
  a first ridge and a second ridge, each on opposite sides of the plate and at an angle with respect to a plane along a surface of the plate;
  a substrate of an insulating material with metal traces, the first ridge and the second ridge conductively attached to the substrate;
  a first MOS field-effect transistor (FET) chip and, a second MOSFET chip attached and electrically connected, via wire bonds, to the substrate under the plate, a drain of the first MOSFET connected to an input terminal of the semiconductor package, a source of the first MOSFET tied to a drain of the second MOSFET, and a source of the second MOSFET, together with the second ridge, connected to a ground;
  a driver chip and a controller chip attached to the substrate under the plate and wire bonded to gates of the first and second MOSFET; and
  a capacitor attached to the substrate under the plate and conductively connected to the first ridge and to the drain of the first MOSFET.

2. The semiconductor package of claim 1 further including packaging material filling the space between the substrate and the clip, thereby covering the driver chip, the controller chip, and the capacitor while leaving outer surfaces of the plate, the first ridge, the second ridge, and the substrate free of packaging material.

3. The semiconductor package of claim 2 wherein the first ridge and the second ridge are bent away from the plate at an acute angle with respect to the plane along the surface of the plate.

4. The semiconductor package of claim 3 wherein the distance between the substrate and the plate is greater than heights of each of the capacitor and a height of a loop of the wire bonds.

5. The semiconductor package of claim 1 wherein the first and the second MOSFETs are made of gallium nitride.

6. The semiconductor package of claim 1 wherein the insulating material is made of a ceramic material.

7. The semiconductor package of claim 1 wherein the plate, the first ridge, and the second ridge are selected from a group consisting of copper, copper alloy, aluminum, silver, and graphene.

8. The semiconductor package of claim 7 further including a metallurgical configuration of an outside surface of the plate suitable for radiating thermal energy.

9. The semiconductor package of claim 1 wherein the plate roofs over a portion of the substrate between the first ridge and the second ridge.

10. The semiconductor package of claim 1 wherein the driver chip and the controller chip are located horizontally side-by-side.

11. The semiconductor package of claim 1 wherein the semiconductor package functions as a power supply module.

12. A semiconductor package comprising:
a plate including an area;
a first extension and a second extension, each on opposite sides of the plate and at an angle with respect to a plane along a surface of the plate;
a substrate of an insulating material with metal traces, the first extension and the second extension conductively attached to the substrate;
a first MOS field-effect transistor (FET) chip and a second MOSFET chip attached and electrically connected, via wire bonds, to the substrate under the plate, a drain of the first MOSFET connected to an input terminal of the semiconductor package, a source of the first MOSFET tied to a drain of the second MOSFET, and a source of the second MOSFET, together with the second extension, connected to a ground;
a driver chip and a controller chip attached to the substrate under the plate and wire bonded to gates of the first and second MOSFET; and
a passive component attached to the substrate under the plate and conductively connected to the first extension and to the drain of the first MOSFET.

13. The semiconductor package of claim 12 wherein the passive component is a capacitor.

14. The semiconductor package of claim 12 wherein the first extension and the second extension are at acute angles with respect to the plane along the surface of the plate.

15. The semiconductor package of claim 12 wherein the plate roofs over a portion of the substrate between the first extension and the second extension.

16. The semiconductor package of claim 12 wherein the driver chip and the controller chip are located horizontally side-by-side.

17. The semiconductor package of claim 12 wherein the insulating material is ceramic material.

* * * * *